(12) United States Patent
Mizuno et al.

(10) Patent No.: US 11,139,161 B2
(45) Date of Patent: Oct. 5, 2021

(54) METHOD OF PROCESSING SUBSTRATES AND SUBSTRATE PROCESSING APPARATUS

(71) Applicant: Tokyo Electron Limited, Tokyo (JP)

(72) Inventors: Hideki Mizuno, Miyagi (JP); Yoshinori Suzuki, Shanghai (CN)

(73) Assignee: Tokyo Electron Limited, Tokyo (JP)

( * ) Notice: Subject to any disclaimer, the term of this patent is extended or adjusted under 35 U.S.C. 154(b) by 77 days.

(21) Appl. No.: 16/776,774

(22) Filed: Jan. 30, 2020

(65) Prior Publication Data

US 2020/0251329 A1 Aug. 6, 2020

(30) Foreign Application Priority Data

Feb. 1, 2019 (JP) .............................. JP2019-017380

(51) Int. Cl.
*H01L 21/311* (2006.01)
*H01L 21/02* (2006.01)

(52) U.S. Cl.
CPC .... *H01L 21/02164* (2013.01); *H01L 21/0217* (2013.01); *H01L 21/02252* (2013.01); *H01L 21/31116* (2013.01); *H01L 21/31144* (2013.01)

(58) Field of Classification Search
CPC ......... H01L 21/31116; H01L 21/02164; H01L 21/0217; H01L 22/10; H01L 22/12; H01L 22/20; H01L 21/31144; H01L 21/02252; H01L 27/11582; H01L 27/11556; H01L 27/1157

See application file for complete search history.

(56) References Cited

U.S. PATENT DOCUMENTS

| | | | | |
|---|---|---|---|---|
| 9,412,617 B2* | 8/2016 | Narishige | ......... | H01J 37/32449 |
| 9,536,707 B2* | 1/2017 | Ishita | ................ | H01J 37/32091 |
| 9,666,446 B2* | 5/2017 | Tominaga | ......... | H01L 21/31116 |
| 2016/0336191 A1* | 11/2016 | Saitoh | ................ | H01L 21/31116 |
| 2018/0061659 A1* | 3/2018 | Tan | ......... | C23C 16/50 |
| 2018/0350830 A1* | 12/2018 | Lim | .................... | H01L 29/1037 |
| 2019/0198333 A1* | 6/2019 | Tokashiki | ......... | H01L 21/32137 |

FOREIGN PATENT DOCUMENTS

JP 2016-051750 4/2016

* cited by examiner

*Primary Examiner* — Michael M Trinh
(74) *Attorney, Agent, or Firm* — IPUSA, PLLC

(57) ABSTRACT

A method for processing substrates includes providing a first substrate including a first region and a second region, the first region including a stack of a silicon oxide film and a silicon nitride film, the second region including a single layer of a silicon oxide film; etching the first substrate with a process gas including a sulfur containing gas, in accordance with varied flow rates of the sulfur containing gas, thereby determining each relationship between a given flow rate from among the varied flow rates of the sulfur containing gas and a shape difference between respective recessed portions formed in the first region and the second region; determining a flow rate of the sulfur containing gas on a basis of each relationship; and etching a second substrate at the determined flow rate of the sulfur containing gas.

19 Claims, 4 Drawing Sheets

METHOD OF PROCESSING SUBSTRATES AND SUBSTRATE PROCESSING APPARATUS

CROSS-REFERENCE TO RELATED APPLICATION

This patent application claims priority to Japanese Patent Application No. 2019-17380, filed Feb. 1, 2019, the entire contents of which are incorporated herein by reference in their entirety.

TECHNICAL FIELD

The present disclosure relates to a method of processing substrates and a substrate processing apparatus.

BACKGROUND

Substrate processing apparatuses are known to desirably perform processing such as an etching process of a substrate. In the etching process, a process gas is injected into a chamber, and radio frequency power is supplied to an electrode in the chamber.

Japanese Unexamined Patent Application Publication No. 2016-051750, which is referred to as Patent document 1, discloses a method of etching a first region and a second region, where the first region includes a film stack in which a silicon oxide film and a silicon nitride film are alternately laminated; and the second region includes a single layer of a silicon oxide film.

SUMMARY

In one aspect, the present disclosure provides a method of processing substrates and a substrate processing apparatus whereby a shape difference between a first region and a second region is reduced in etching the first region and the second region, the first region including a film stack of a silicon oxide film and a silicon nitride film, the second region including a single layer of a silicon oxide film.

In one aspect of the present disclosure, a method for processing substrates is provided, including: providing a first substrate including a first region and a second region, the first region including a stack of a silicon oxide film and a silicon nitride film, the second region including a single layer of a silicon oxide film; etching the first substrate with a process gas including a sulfur containing gas, in accordance with varied flow rates of the sulfur containing gas, thereby determining each relationship between a given flow rate from among the varied flow rates of the sulfur containing gas and a shape difference between respective recessed portions formed in the first region and the second region; determining a flow rate of the sulfur containing gas on a basis of each relationship; and etching a second substrate at the determined flow rate of the sulfur containing gas, the second substrate including a first region and a second region, the first region including a stack of a silicon oxide film and a silicon nitride film, and the second region including a single layer of a silicon oxide film.

DESCRIPTION OF THE PREFERRED EMBODIMENTS

Figure 1:
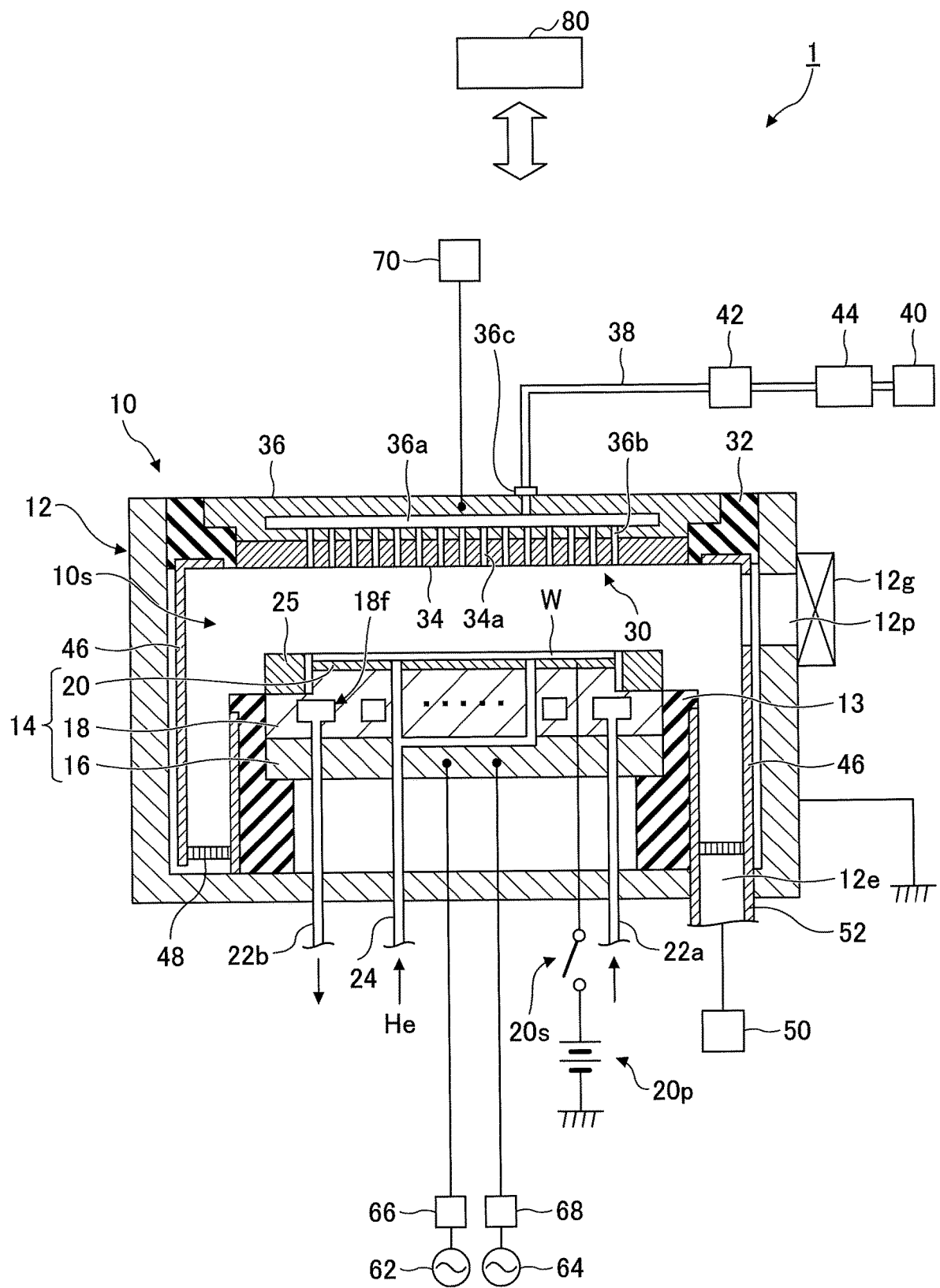
FIG. 1 is a schematically cross-sectional view of an example of a substrate processing apparatus according to the present embodiment.

One or more embodiments will be hereinafter described with reference to the drawings. In each drawing, the same reference numerals are used to denote same components; accordingly, duplicative explanations may be not provided for the same components.

A substrate processing apparatus 1 according to the present embodiment will be described with reference to FIG. 1. FIG. 1 is a schematically cross-sectional view of an example of the substrate processing apparatus 1 according to the present embodiment.

The substrate processing apparatus 1 includes a chamber 10. The chamber 10 has a space 10s within the chamber. The chamber 10 includes a chamber body 12. The chamber body 12 has an approximately cylindrical shape. The chamber body 12 is formed of aluminum, for example. A film having corrosion resistance is disposed on an inner wall of the chamber body 12. The film may include ceramics such as aluminum oxide or yttrium oxide.

A passage 12p is formed in a sidewall of the chamber body 12. A substrate W is transferred between the space 10s and the outside of the chamber 10, through the passage 12p. The passage 12p is openable and closable by a gate valve 12g. The gate valve 12g is disposed along the sidewall of the chamber body 12.

A support 13 is disposed at a bottom portion of the chamber body 12. The support 13 is formed of an insulating material. The support 13 has an approximately cylindrical shape. In the space 10s, the support 13 extends upwardly from the bottom portion of the chamber body 12. The support 13 includes a stage 14 on an upper portion of the support. The stage 14 is configured to support the substrate W in the space 10s.

The stage 14 includes a lower electrode 18 and an electrostatic chuck 20. The stage 14 may further include an electrode plate 16. The electrode plate 16 is formed of a conductor such as aluminum, and has an approximately disk shape. The lower electrode 18 is disposed on the electrode plate 16. The lower electrode 18 is formed of a conductor such as aluminum, and has an approximately disk shape. The lower electrode 18 is electrically connected to the electrode plate 16.

An electrostatic chuck 20 is disposed on the lower electrode 18. The substrate W is placed on an upper surface of the electrostatic chuck 20. The electrostatic chuck 20 includes a main body and an electrode. The main body of the electrostatic chuck 20 has an approximately disk shape and is formed of a dielectric body. The electrode of the electrostatic chuck 20 is a film electrode and is disposed within the main body of the electrostatic chuck 20. The electrode of the electrostatic chuck 20 is connected to a direct current (DC)

power supply 20*p*, via a switch 20*s*. When a voltage is applied to the electrode of the electrostatic chuck 20, by the DC power supply 20*p*, electrostatic attractive force is generated between the electrostatic chuck 20 and the substrate W. With such electrostatic attractive force being applied, the substrate W is retained by the electrostatic chuck 20.

An edge ring 25 is disposed on the periphery of the lower electrode 18 so as to surround edges of the substrate W. The edge ring 25 allows for improvements in in-plane uniformity in a plasma process of a substrate W. The edge ring 25 may be formed of silicon, silicon carbide, quartz, or the like.

A flow path 18*f* is provided within the lower electrode 18. A heat exchange medium (e.g., coolant) is supplied to the flow path 18*f* through a pipe 22*a*, by a chiller unit (not illustrated) provided outside the chamber 10. The heat exchange medium supplied to the flow path 18*f* is returned to the chiller unit, through a pipe 22*b*. In the substrate processing apparatus 1, a temperature of the substrate W placed on the electrostatic chuck 20 is controlled by heat exchange between the heat exchange medium and the lower electrode 18.

The substrate processing apparatus 1 includes a gas supply line 24. The gas supply line 24 supplies a heat-transfer gas (e.g., He gas) from a mechanism for supplying a heat transfer gas, to a portion between an upper surface of the electrostatic chuck 20 and a rear surface of the substrate W.

The substrate processing apparatus 1 further includes an upper electrode 30. The upper electrode 30 is disposed above the stage 14. The upper electrode 30 is supported at an upper portion of the chamber body 12, by using a member 32. The member 32 is formed of an insulating material. The upper electrode 30 and the member 32 covers an upper opening of the chamber body 12.

The upper electrode 30 may include a top plate 34 and a support 36. A lower surface of the top plate 34 is a lower surface toward the space 10*s* and defines part of the space 10*s*. The top plate 34 may be formed of a semiconductor or a low resistance conductor having low Joule heating. A plurality of holes 34*a* for discharging gases are provided through the top plate 34, in a through-plane direction of the top plate.

The support 36 removably supports the top plate 34. The support 36 is formed of a conductive material such as aluminum. A gas diffuser chamber 36*a* is disposed within the support 36. The support 36 has multiple gas holes 36*b* each extending downwardly from the gas diffuser chamber 36*a*. The gas holes 36*b* are in communication with the respective holes 34*a* for discharging gases. The support 36 is provided with a gas inlet 36*c*. The gas inlet 36*c* is connected to the gas diffuser chamber 36*a*. A gas supply line 38 is connected to the gas inlet 36*c*.

The gas supply line 38 is connected with a gas source group 40, a valve group 42, and a flow controller group 44. The gas source group 40, the valve group 42, and the flow controller group 44 serve as a gas supply. The gas source group 40 includes a plurality of gas sources. The valve group 42 includes a plurality of on-off valves. The flow controller group 44 includes a plurality of flow controllers. Each flow controller of the flow controller group 44 is a mass flow controller or a pressure control type-flow controller. Each gas source of the gas source group 40 is connected to a corresponding on-off valve of the valve group 42 and a corresponding flow controller of the flow controller group 44, through the gas supply line 38.

With respect to the substrate processing apparatus 1, a shield 46 is removably mounted on an inner wall surface of the chamber body 12 and the outer periphery of the support 13. The shield 46 prevents reactive byproducts from adhering to the chamber body 12. For example, the shield 46 includes a surface formed of an aluminum base material; and a corrosion-resistant film on the surface. The corrosion-resistant film may be formed of a ceramic such as yttrium oxide.

A baffle plate 48 is disposed between the support 13 and the sidewall of the chamber body 12. For example, the baffle plate 48 includes a corrosion-resistant film (a film such as yttrium oxide) formed on the surface of an aluminum base material. A plurality of through-holes are formed through the baffle plate 48. An exhaust port 12*e* is provided below the baffle plate 48 and at the bottom of the chamber body 12. An exhaust device 50 is connected to the exhaust port 12*e* through an exhaust pipe 52. The exhaust device 50 includes a pressure regulating valve and a vacuum pump such as a turbo molecular pump.

The substrate processing apparatus 1 includes a first radio frequency power supply 62 and a second radio frequency power supply 64. The first radio frequency power supply 62 is a power source that generates first radio frequency power. The first radio frequency power is rated at frequencies suitable for forming of a plasma. For example, the first radio frequency power is rated at frequencies in a range of from 27 MHz to 100 MHz. The first radio frequency power supply 62 is connected to the lower electrode 18, via a matcher 66 and the electrode plate 16. The matcher 66 includes a circuit for matching between an output impedance of the first radio frequency power supply 62 and an impedance of a load side (lower electrode 18 side). Note that the first radio frequency power supply 62 may be connected to the upper electrode 30, via the matcher 66. The first radio frequency power supply 62 serves as a plasma generator as an example.

The second radio frequency power supply 64 is a power source that generates second radio frequency power. The second radio frequency power is rated at frequencies lower than first radio frequency power. When both of first radio frequency power and second radio frequency power are supplied, the second radio frequency power is supplied as bias radio frequency power that causes ions to be attracted to a given substrate W. For example, the second radio frequency power is rated at frequencies in a range of from 40 kHz to 13.56 MHz. The second radio frequency power supply 64 is connected to the lower electrode 18, via a matcher 68 and the electrode plate 16. The matcher 68 includes a circuit for matching between an output impedance of the second radio frequency power supply 64 and an impedance of a load side (lower electrode 18 side).

Note that, without supplying first radio frequency power, second radio frequency power may be supplied to form a plasma. In other words, only one radio frequency power may be supplied to form a plasma. In this case, second radio frequency power may be rated at frequencies higher than 13.56 MHz. For example, the second radio frequency power may be rated at 40 MHz. The substrate processing apparatus 1 may not include a first radio frequency power supply 62 and a matcher 66. The second radio frequency power supply 64 serves as a plasma generator as an example.

In the substrate processing apparatus 1, a gas is supplied to the space 10*s* by a gas supply, to form a plasma. Also, at least one of first radio frequency power and second radio frequency power is supplied to produce a radio frequency electric field between the upper electrode 30 and the lower electrode 18. The produced radio frequency electric field causes a plasma.

The substrate processing apparatus 1 includes a power supply 70. The power supply 70 is connected to the upper electrode 30. The power supply 70 applies a voltage to the upper electrode 30, such that positive ions in the space 10s are thereby attracted to the top plate 34.

The substrate processing apparatus 1 may further include a controller 80. The controller 80 may be a computer that includes a processor; a storage device such as a memory; an input device; a display device; an input-and-output interface of a signal; and the like. The controller 80 controls each component of the substrate processing apparatus 1. The controller 80 can perform processing or the like in accordance with a command or the like for managing the substrate processing apparatus 1, where the command is input through the input device used by an operator. The controller 80 can also display an operation status of the substrate processing apparatus 1, on the display device. The operation status can be thereby visualized. The storage device stores a control program and recipe data. The control program is executed by the processor to execute various processes at the substrate processing apparatus 1. The processor executes such a control program and controls each component of the substrate processing apparatus 1, in accordance with recipe data.

Figure 2:
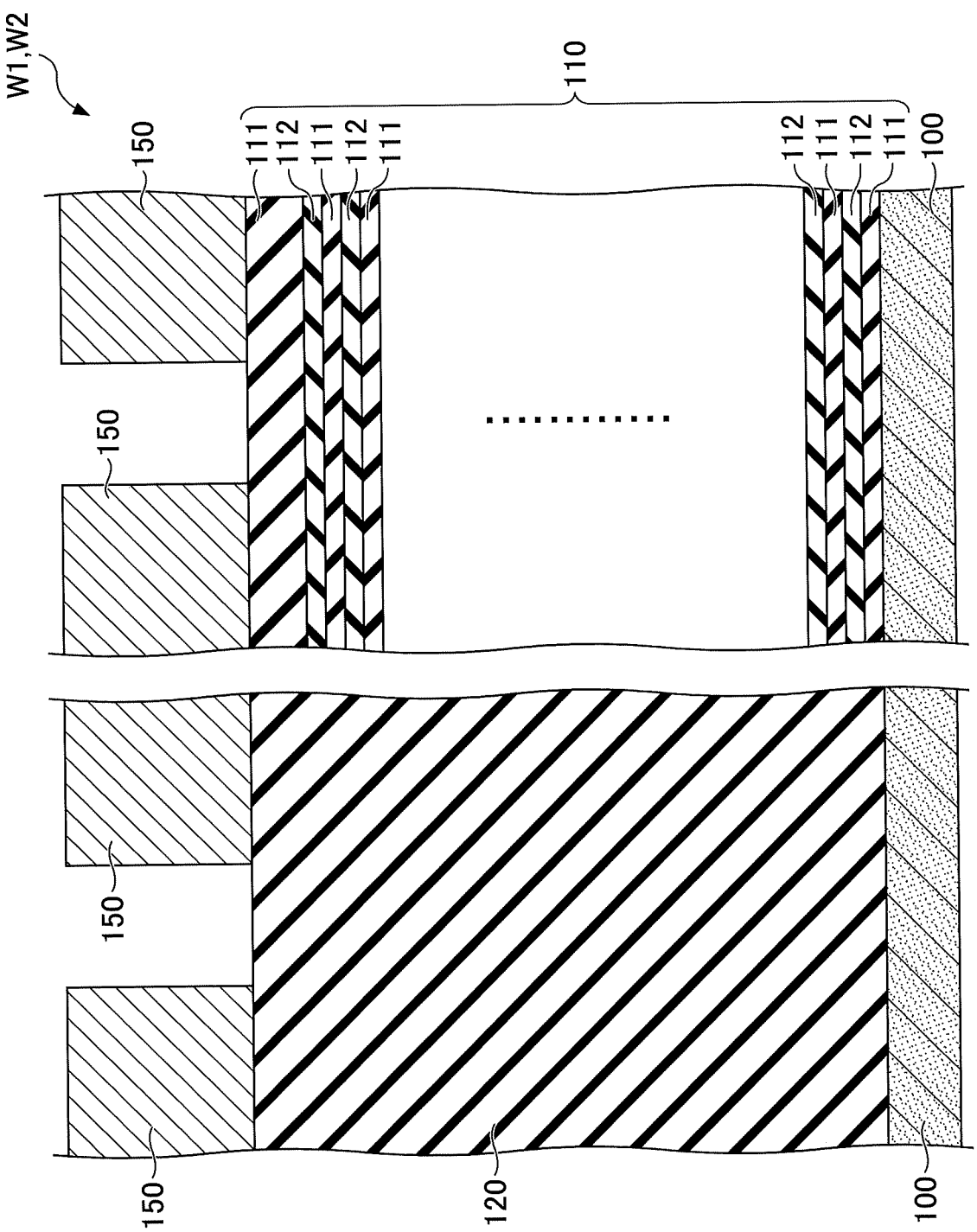
FIG. 2 is a schematically cross-sectional view of an example of a first substrate and second substrate to be processed by the substrate processing apparatus according to the present embodiment.

FIG. 2 is a cross-sectional diagram illustrating an example of a structure of a first substrate W1 and a second substrate W2 processed by the substrate processing apparatus 1 according to the present embodiment. The first substrate W1 is a test substrate used to determine a flow rate or the like of a sulfur containing gas, as described in steps S2 and S3 (see FIG. 3) below. The second substrate W2 is a substrate used to manufacture a semiconductor device as a product, as described in step S4 (see FIG. 3) below.

As illustrated in FIG. 2, the second substrate W2 includes an underlayer 100; a first region 110; a second region 120; and a mask 150. The underlayer 100 is a polycrystal silicon layer disposed on a given substrate, for example. The first region 110 and the second region 120 are each set on the underlayer 100.

The first region 110 (also referred to as an on-layer stack) includes a film stack in which a silicon oxide film 111 and a silicon nitride film 112 are alternately laminated. The second region 120 (also referred to as an ox-layer) includes a single layer of a silicon oxide film. A thickness for the first region 110 is approximately equal to a thickness for the second region 120. The film stack of the first region 110 and the single film of the second region 120 are both etched.

A mask 150 is disposed on films of the first region 110 and the second region 120. The mask 150 has a pattern for forming holes or slits in the first region 110 and the second region 120. The substrate processing apparatus 1 etches the first region 110 and the second region 120, by using holes of the mask 150, to form recessed portions such as holes or slits.

The first substrate W1 has the same structure as the second substrate W2. Note that, as illustrated in FIG. 2, the first substrate W1 as a single substrate may include the first region 110 and the second region 120. Alternatively, when a first region 110 and a second region 120 are separately formed with respective substrates, a set of two substrates may be used as the first substrate W1.

When a silicon nitride film and a silicon oxide film are etched simultaneously, an etch rate of the silicon oxide film tends to be higher than that of the silicon nitride film. Additionally, a recessed portion of the silicon oxide film formed by etching tends to have a dimension in width (CD (Critical Dimension) value) that is greater than the silicon nitride film. For this reason, when the first region 110 including a film stack of a silicon oxide film 111 and a silicon nitride film 112; and the second region 120 including a single layer of a silicon oxide film, are etched simultaneously, there may be a shape difference between respective recessed portions formed in the first region 110 and in the second region 120.

In recent years, the number of laminated films has increased, and as a result, such a shape difference may be further increased. With the shape difference occurring, after etching of a silicon oxide film of which etch rate is higher, a film stack continues to be etched. In such a manner, controlling of the CD described above could not be easily performed due to overetching of a silicon oxide film.

Such a CD control is achieved by controlling of an $O_2$ gas. However, if the controlling is performed such that a shape difference between a film stack and a silicon oxide film is reduced, a necking CD as described below greatly increases, and thus an etch rate is greatly decreased.

In light of the issue as recognized by the inventors, in a method of processing substrates according to the present embodiment, a sulfur containing gas is added to a process gas, and a flow rate of the sulfur containing gas is controlled. In such a manner, an etch rate of a film stack and an etch rate of a silicon oxide film are controlled to be approximately equal. Thereby, a shape difference between recessed portions formed in respective films due to etching can be substantially eliminated, without causing the issue about a necking CD or an etch rate. As a result, a difference between the respective maximum CDs for the first region 110 and the second region 120 can be reduced.

Figure 3:
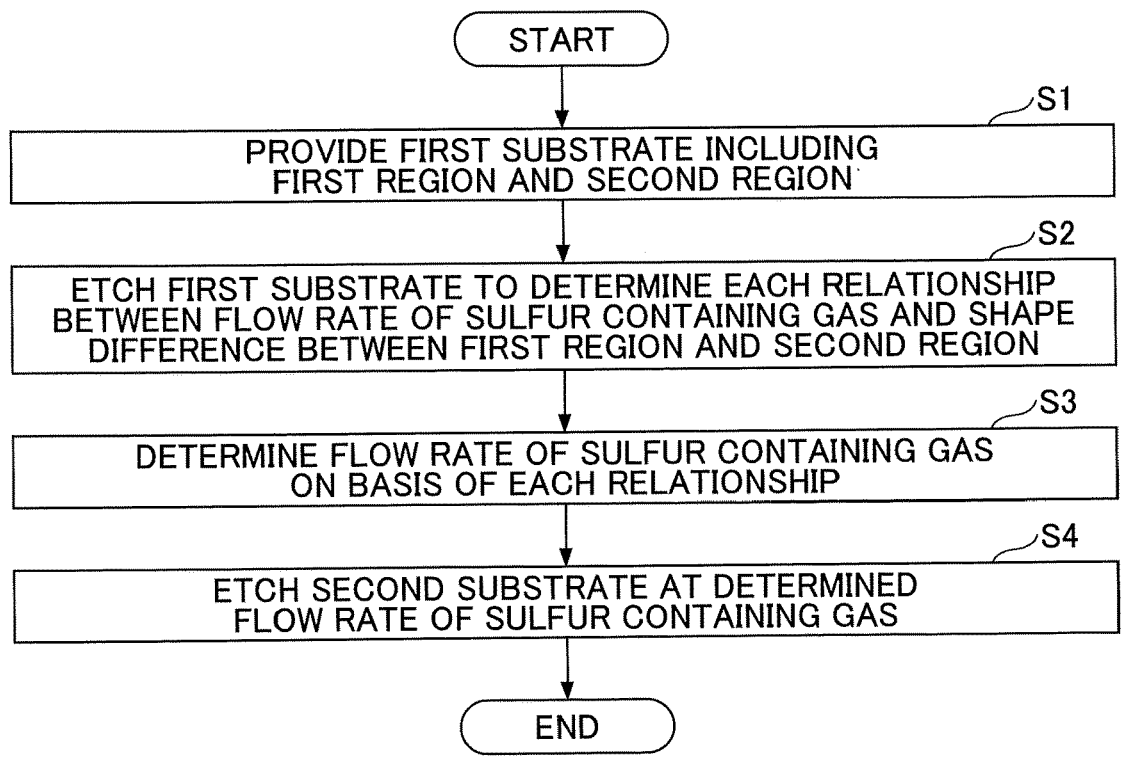
FIG. 3 is a flowchart illustrating substrate processing by the substrate processing apparatus according to the present embodiment.

Hereafter, a method of processing substrates performed by the substrate processing apparatus 1 according to the present embodiment will be described with reference to FIG. 3. FIG. 3 is a flowchart illustrating substrate processing by the substrate processing apparatus 1 according to the present embodiment.

In step S1, a first substrate W1 (see FIG. 2) including a first region 110 and a second region 120 is provided. The controller 80 opens the gate valve 12g. A transfer device that is not illustrated causes the first substrate W1 to be placed on the stage 14 by using the passage 12p. The controller 80 operates the switch 20s. Thereby, the first substrate W1 is retained by the electrostatic chuck 20. The transfer device exits the passage 12p, and then the controller 80 closes the gate valve 12g.

In step S2, the first substrate W1 is etched at varied flow rates of a sulfur containing gas contained in a process gas. Thereby, each relationship between a given varied flow rate from among the flow rates of the sulfur containing gas and a shape difference between respective recessed portions formed in the first region 110 and the second region 120, is determined.

In this example, a process gas or the like is supplied to the space 10s by the gas source group 40, and the first substrate W1 is etched with a plasma. The process gas supplied to the space 10s may include a hydrofluorocarbon gas (HCF gas), a fluorocarbon gas (CF gas), an oxygen containing gas, a sulfur containing gas, a noble gas, and the like.

The HCF gas causes a silicon nitride film to be etched at a higher etch rate than a silicon oxide film. The HCF gas can include at least one of $CH_2F_2$ and $CHF_3$, for example. The CF gas and the oxygen containing gas each cause a silicon nitride film to be etched at a higher etch rate than a silicon oxide film. For example, the CF gas can include at least one from among $C_4F_6$, $O_4F_8$, and $C_3F_8$. For example, the oxygen containing gas can include at least one from among $O_2$, $O_3$, or the like.

For a sulfur containing gas, contained sulfur is absorbed to sides of a given recessed portion formed in the first region 110 and the second region 120, so that a CD value is thereby decreased. The sulfur is adsorbed onto a silicon oxide film more easily than a silicon nitride film. In such a manner, by controlling a flow rate of a sulfur containing gas, a difference between etch rates for the first region 110 and the second region 120 can be decreased, so that a difference between CD values for the first region 110 and the second region 120 can be thereby decreased. Accordingly, a shape difference between respective recessed portions formed in the first region 110 and the second region 120 can be reduced. For example, the sulfur containing gas can include at least one from among COS, $SO_2$, and $SF_6$.

Figure 4:
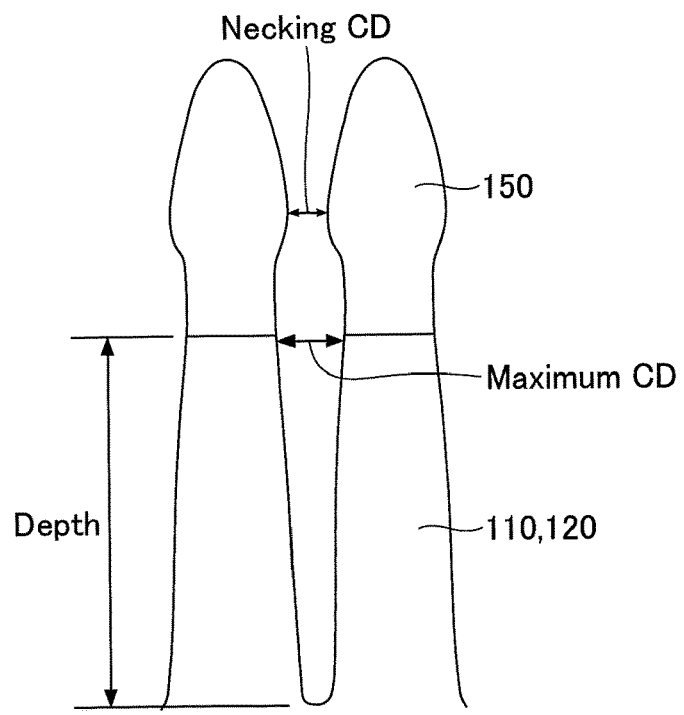
FIG. 4 is a schematic diagram illustrating each dimension of a recessed portion formed in an etching process.
Figure 5:
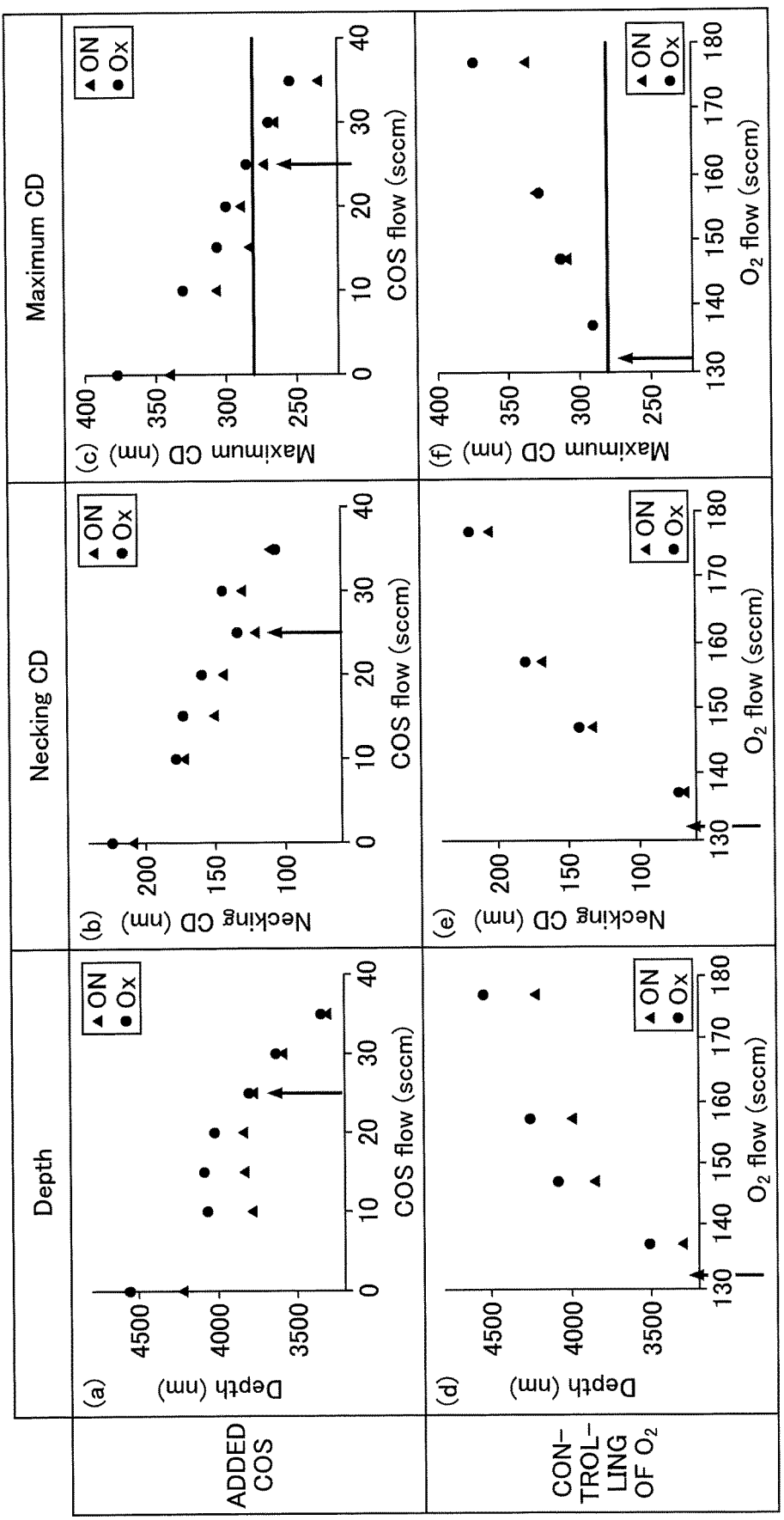
FIG. 5 is a diagram illustrating, in each graph, a relationship between a flow rate of a sulfur containing gas and a dimension for a given recessed portion formed in an etching process.

FIG. 4 is a schematic diagram illustrating each dimension of a recessed portion formed in an etching process. The recessed portion formed in an etching process means a space formed in a first region 110 and a second region 120. FIG. 5 is a diagram illustrating, in each graph, a relationship between a flow rate of a sulfur containing gas and a dimension for a given recessed portion formed in an etching process. In FIG. 5, a processing condition where COS is added, as well as a processing condition where a flow rate of $O_2$ is controlled, are given as follows.

<Condition where COS is Added>
Processing pressure: 2.7 Pa
Flow rate of COS: 10 to 35 sccm
Flow rate of each of $C_4F_6$, $C_4F_8$, and $C_3F_8$: 180 sccm
Flow rate of $CH_2F_2$: 150 sccm
Flow rate of $O_2$: 177 sccm
First radio frequency power: 3300 W rated at 40 MHz
Second radio frequency power: 14000 W rated at 0.4 MHz
Processing time: 600 seconds <Condition where Flow Rate of $O_2$ is Controlled>
Processing pressure: 2.7 Pa
Flow rates of each of $C_4F_6$, $O_4F_8$, and $C_3F_8$: 180 sccm
Flow rate of $CH_2F_2$: 150 sccm
Flow rate of $O_2$: 130 to 180 sccm
First radio frequency power: 3300 W rated at 40 MHz
Second radio frequency power: 14000 W rated at 0.4 MHz
Processing time: 600 seconds As illustrated in FIG. 4, with respect to a recessed portion formed in an etching process, the minimum CD value for a mask 150 is referred to as a "necking CD". With respect to a recessed portion formed in an etching process, the maximum CD value for each of a first region 110 and a second region 120 is referred to as the "maximum CD". A depth of a recessed portion in a given film etched in a etching process is referred to as a "depth".

In a case where COS as an example of a sulfur containing gas is added, FIG. 5 (a) illustrates a relationship between a flow rate of COS and a depth; FIG. 5 (b) illustrates a relationship between a flow rate of COS and a necking CD; and FIG. 5 (c) illustrates a relationship between a flow rate of COS and the maximum CD. In each graph, a black triangle indicates a value for a first region 110 (including an on-layer stack), and a black circle indicates a value for a second region 120 (including an Ox-layer).

As illustrated in FIG. 5 (a) to (c), by controlling a flow rate of COS contained in a process gas, a difference between respective depths for a first region 110 and a second region 120 can be reduced, as well as enabling to reduce a difference between the maximum CDs for the first region 110 and the second region 120. In other words, by controlling a COS flow (flow rate of COS), a shape difference between respective recessed portions formed in the first region 110 and the second region 120 can be reduced.

In a reference example where a flow rate of $O_2$ is controlled, FIG. 5(d) illustrates a relationship between a flow rate of $O_2$ and a depth; FIG. 5(e) illustrates a relationship between a flow rate of $O_2$ and a necking CD; and FIG. 5(f) illustrates a relationship between a flow rate of $O_2$ and the maximum CD.

As illustrated in FIG. 5(d) to (f), when a flow rate of $O_2$ is controlled such that a difference between the respective maximum CDs for a first region 110 and a second region 120 is reduced, a difference between respective depths for the first region 110 and the second region 120 cannot be reduced. In other words, under control of a flow rate of $O_2$, a difference between the maximum CDs; and a difference between the depths cannot be reduced concurrently. As a result, a shape difference between respective recessed portions formed in the first region 110 and the second region 120 is not easily reduced.

When each of a flow rate of COS and a flow rate of $O_2$ is determined from the target maximum CD (which is indicated by a corresponding lateral solid line in FIG. 5(c) or (f)), a given depth for the determined flow rate (which is indicated by an arrow in FIG. 5(c) or (f)) is increased in the case where COS is added to control a flow rate, compared to the case where a flow rate of $O_2$ is controlled. In other words, in the present embodiment for adding COS, an etch rate is higher than that in the reference example of controlling a flow rate of $O_2$.

Additionally, a necking CD for the determined flow rate is increased in the case where COS is added to control a flow rate, compared to the case where a flow rate of $O_2$ is controlled. When a necking CD is decreased, an opening in a given mask 150 may be blocked by depositions or the like. In the present embodiment for adding COS, spacing for preventing blocking of a given opening of the mask 150 can be reliably provided, unlike the reference example of controlling a flow rate of $O_2$.

Referring back to FIG. 3, in step S3, a flow rate of a sulfur containing gas is determined on the basis of each relationship determined in step S2. For example, a flow rate of a sulfur containing gas is determined such that a difference between the respective maximum CDs for a first region 110 and a second region 120 is smaller than or equal to a predetermined threshold. For example, a rate expressing as such a difference between the respective maximum CDs, to the maximum CD for a first region 110 is set to be smaller than or equal to 5%. Relationship information determined in step S2 is preliminarily stored in a memory of the controller 80, and the processor of the controller 80 determines a flow rate of a sulfur containing gas in accordance with the relationship information.

A flow rate of a sulfur containing gas may be determined based on an etch rate of a first region 110 and an etch rate of a second region 120. A flow rate of a sulfur containing gas may be determined such that a difference between etch rates of a first region 110 and a second region 120 is smaller than or equal to a predetermined threshold.

A flow rate of a sulfur containing gas may be determined based on a depth for a first region 110 and a depth for a second region 120. A flow rate of a sulfur containing gas may be determined such that a difference between respective depths for a first region 110 and a second region 120 is smaller than or equal to a predetermined threshold.

A flow rate of a sulfur containing gas may be determined based on a necking CD for a first region 110 and a necking CD for a second region 120. For example, a flow rate of a sulfur containing gas may be determined such that a given necking CD is greater than or equal to a predetermined threshold.

Note that a first substrate W1 is etched in step S2, and then is ejected from the chamber body 12, through the passage 12p before step S4 is started.

In step S4, a second substrate W2 is etched at the flow rate of a sulfur containing gas, as determined in step S3. First, the controller 80 opens a gate valve 12g. A transfer device that is not illustrated causes the second substrate W2 to be placed on the stage 14 by using the passage 12p. The controller 80 operates a switch 20s. Thereby, the second substrate W2 is retained by the electrostatic chuck 20. The transfer device exits the passage 12p, and then the controller 80 closes the gate valve 12g. Next, a process gas or the like is supplied to the space 10s by the gas source group 40, and the second substrate W2 is etched with a plasma. The process gas supplied to the space 10s includes a hydrofluorocarbon gas (HCF gas), a fluorocarbon gas (CF gas), an oxygen containing gas, a sulfur containing gas, a noble gas, and the like.

Note that when the second substrate W2 is etched with a plasma, recipes may be changed to change a type, flow rate, or the like of at least one of a CF gas, a HCF gas, and an oxygen containing gas. In this case as well, a flow rate of a sulfur containing gas can be set to a flow rate determined in step S3.

As described above, in the substrate processing by the substrate processing apparatus 1 according to the present embodiment, when a first region 110 and a second region 120 of the second substrate W2 are etched simultaneously, a shape difference between respective recessed portions formed in the first region 110 and the second region 120 can be reduced.

The embodiment or the like has been described using the substrate processing apparatus 1. However, the present disclosure is not limited to the above embodiment or the like, and various modifications or alternatives can be made within departing from the scope of the present disclosure.

A condition on a process gas other than a sulfur containing gas may be determined in the following step: etching a first substrate W1 with a process gas that does not contain a sulfur containing gas, thereby determining the condition such that a shape difference between respective recessed portions for a first region 110 and a second region 120 is in a predetermined range.

The substrate processing apparatus 1 in the present disclosure is applicable to any type of substrate processing apparatus including a capacitively coupled plasma (CCP), an inducibly coupled plasma (ICP), a radial line slot antenna (RLSA), an electron cyclotron resonance plasma (ECR), and a helicon wave plasma (HWP).

What is claimed is:

1. A method for processing substrates comprising:
providing a first substrate including a first region and a second region, the first region including a stack of a silicon oxide film and a silicon nitride film, the second region including a single layer of a silicon oxide film;
etching the first substrate with a process gas including a sulfur containing gas, in accordance with varied flow rates of the sulfur containing gas, thereby determining each relationship between a given flow rate from among the varied flow rates of the sulfur containing gas and a shape difference between respective recessed portions formed in the first region and the second region;
determining a flow rate of the sulfur containing gas on a basis of each relationship; and
etching a second substrate at the determined flow rate of the sulfur containing gas, the second substrate including a first region and a second region, and the first region including a stack of a silicon oxide film and a silicon nitride film, the second region including a single layer of a silicon oxide film.

2. The method according to claim 1, wherein in the determining each relationship, the shape difference is a difference between respective maximum critical dimensions of recessed portions formed in the first region and the second region.

3. The method according to claim 2, wherein the determining a flow rate includes determining a flow rate of the sulfur containing gas such that a difference between the respective maximum critical dimensions for the first region and the second region is smaller than or equal to a predetermined threshold.

4. The method according to claim 2, wherein the determining a flow rate includes determining a flow rate of the sulfur containing gas such that a rate expressing as a difference between the respective maximum critical dimensions for the first region and the second region, to a maximum critical dimension for the first region, is smaller than or equal to 5%.

5. The method according to claim 1, wherein the determining each relationship includes determining each relationship between, a given flow rate from among the varied flow rates of the sulfur containing gas and a difference between respective etch rates of the recessed portions formed in the first region and the second region.

6. The method according to claim 5, wherein the determining a flow rate includes determining a flow rate of the sulfur containing gas such that the difference between the etch rates of the first region and the second region is smaller than or equal to a predetermined threshold.

7. The method according to claim 1, wherein in the determining each relationship, the shape difference is a difference between respective depths of the recessed portions formed in the first region and the second region.

8. The method according to claim 7, wherein the determining a flow rate includes determining a flow rate of the sulfur containing gas such that the difference between the depths of the recessed portions formed in the first region and the second region is smaller than or equal to a predetermined threshold.

9. The method according to claim 1, wherein the first substrate includes a mask disposed on films of the first region and the second region, and
wherein the determining each relationship includes determining each relationship between a given flow rate from among the varied flow rates of the sulfur containing gas and a difference between respective minimum widths of the mask used for the recessed portions formed in the first region and the second region.

10. The method according to claim 1, further comprising etching the first substrate with a process gas excluding a sulfur containing gas such that the shape difference is in a predetermined range, to determine a condition of the process gas excluding a sulfur containing gas.

11. The method according to claim 1, wherein the first substrate is a test substrate, and wherein the second substrate is a substrate used in manufacturing a semiconductor device.

12. The method according to claim 1, wherein the sulfur containing gas includes at least one selected from the group consisting of COS, $SO_2$, and $SF_6$.

13. The method according to claim 1, wherein the process gas includes at least one selected from the group consisting of $CH_2F_2$, $C_4F_6$, and $C_4F_8$.

14. The method according to claim 1, wherein the process gas includes a hydrofluorocarbon gas, a fluorocarbon gas, an oxygen containing gas, and a noble gas.

15. The method according to claim 14, wherein the hydrofluorocarbon gas includes at least one of $CH_2F_2$ and $CHF_3$.

16. The method according to claim 14, wherein the fluorocarbon gas includes at least one selected from the group consisting of $C_4F_6$, $C_4F_8$, and $C_3F_8$.

17. The method according to claim 14, wherein the oxygen containing gas includes at least one of $O_2$ and $O_3$.

18. A method for processing substrates comprising:
providing a first substrate including a first region and a second region, the first region including a stack of a silicon oxide film and a silicon nitride film, the second region including a single layer of a silicon oxide film; and
etching the first substrate in accordance with varied flow rates of a sulfur containing gas; and
etching a second substrate at a determined flow rate of the sulfur containing gas, the determined flow rate being determined on a basis of each relationship between a given flow rate from among the varied flow rates of the sulfur containing gas and a shape difference between respective recessed portions formed in the first region and the second region.

19. A substrate processing apparatus comprising:
a chamber;
a stage disposed in the chamber, the stage being configured to support a substrate; and
a controller configured to cause:
providing a first substrate including a first region and a second region, the first region including a stack of a silicon oxide film and a silicon nitride film, the second region including a single layer of a silicon oxide film;
etching the first substrate with a process gas including a sulfur containing gas, in accordance with varied flow rates of the sulfur containing gas, thereby determining each relationship between a given flow rate from among the varied flow rates of the sulfur containing gas and a shape difference between respective recessed portions formed in the first region and the second region;
determining a flow rate of the sulfur containing gas on a basis of each relationship; and
etching a second substrate at the determined flow rate of the sulfur containing gas, the second substrate including a first region and a second region, and the first region including a stack of a silicon oxide film and a silicon nitride film, the second region including a single layer of a silicon oxide film.

\* \* \* \* \*